United States Patent [19]
Yasutake

[11] Patent Number: 5,208,560
[45] Date of Patent: May 4, 1993

[54] SIGNAL TRANSMISSION CIRCUIT

[75] Inventor: Nobuyuki Yasutake, Tokyo, Japan

[73] Assignee: Fujitsu Limited, Kawawaki, Japan

[21] Appl. No.: 930,449

[22] Filed: Aug. 19, 1992

Related U.S. Application Data

[63] Continuation of Ser. No. 618,390, Nov. 27, 1990, abandoned.

[30] Foreign Application Priority Data

Nov. 27, 1989 [JP] Japan .................................. 1-308404

[51] Int. Cl.$^5$ .............................................. H03H 7/00
[52] U.S. Cl. .......................................... 333/12; 333/20
[58] Field of Search ..................... 333/12, 20; 307/443, 307/491

[56] References Cited

U.S. PATENT DOCUMENTS

| | | | |
|---|---|---|---|
| 1,651,729 | 12/1927 | Rüdenberg | 333/12 |
| 3,697,896 | 10/1972 | Sarkozi et al. | 333/12 |
| 3,705,365 | 12/1972 | Szabo et al. | 333/12 |
| 4,264,940 | 4/1981 | Castle | 333/12 X |

FOREIGN PATENT DOCUMENTS

| | | | |
|---|---|---|---|
| 693236 | 7/1940 | Fed. Rep. of Germany | 333/12 |
| 53-147450 | 12/1978 | Japan . | |

Primary Examiner—Paul Gensler
Attorney, Agent, or Firm—Staas & Halsey

[57] ABSTRACT

A signal transmission circuit including a signal line through which the signal is transmitted from a signal source element to a signal receiving element, a grounding line arranged along the length of the signal line, and a high impedance element connected between the grounding line and the ground.

8 Claims, 5 Drawing Sheets

SIGNAL TRANSMISSION CIRCUIT

This application is a continuation of application Ser. No. 07/618,390, filed Nov. 27, 1990, now abandoned.

BACKGROUND OF THE INVENTION

1. Field of the Invention

The present invention relates to a signal transmission circuit. The signal transmission circuit according to the present invention is used, for example, for the transmission of the signal for an exposure process in an electron beam exposing apparatus used in the production of semiconductor devices.

2. Description of the Related Arts

In a prior art signal transmission circuit for an electron beam exposing apparatus, a signal for deflection for an electron beam exposing apparatus is amplified by an amplifier, and the amplified signal is supplied through a node to a coaxial cable as a transmission line, and the signal transmitted through the coaxial cable is supplied to deflection electrodes connected to the coaxial cable. The deflection electrodes are constituted by a pair of electrodes to which positive and negative voltages are applied.

The internal conductor of the coaxial cable is connected to the deflection electrodes, and the external conductor of the coaxial cable is directly connected to the ground.

The electron beam is deflected electrostatically by the signal for deflection supplied to the deflection electrodes through the coaxial cable, and the deflected electron beam is used for exposing a wafer of a semiconductor. Stranded wires are sometimes used in place of the coaxial cable for the signal transmission line.

In such a prior art signal transmission circuit, however, there are problems in that the delay in the transmission of the signal because of the capacitance of the coaxial cable or the twisted wires occurs, and the signal is difficult to transmit at high speed.

That is, in the case where the coaxial cable with the following deflection electrodes is not connected to the node at the output of the amplifier, the voltage of the node is raised quickly in response to the rise of the output voltage of the amplifier, but in the case where the coaxial cable with the following deflection electrodes is connected to the node at the output of the amplifier, the voltage of the node is raised only slowly in response to the rise of the output voltage of the amplifier due to the capacitance of the coaxial cable, thus causing a delay in the establishment of the voltage and preventing the signal from being transmitted at high speed. The problem is similar in the case of the prior art twisted wire transmission circuit.

If a signal transmission circuit without the coaxial cable structure is used for reducing the capacitance, there are problems in that the characteristic impedance of the transmission line is higher than that of the coaxial cable or the twisted wires, that the effect of the shielding is not sufficient, and that the signal transmission circuit is apt to be affected by external noise.

SUMMARY OF THE INVENTION

It is an object of the present invention to provide an improved signal transmission circuit in which the delay in the transmission of the signal is greatly reduced, the affect of noise is greatly reduced, and signal transmission at an extremely high speed is attained.

According to the present invention, there is provided a signal transmission circuit between a signal source element and a signal receiving element for transmitting a signal therethrough, comprising a signal line through which the signal is transmitted from the signal source element to the signal receiving element; a gounding line arranged along the length of the signal line; and a high impedance element connected between the grounding line and ground level portion.

DESCRIPTION OF THE PREFERRED EMBODIMENTS

Figure 1:
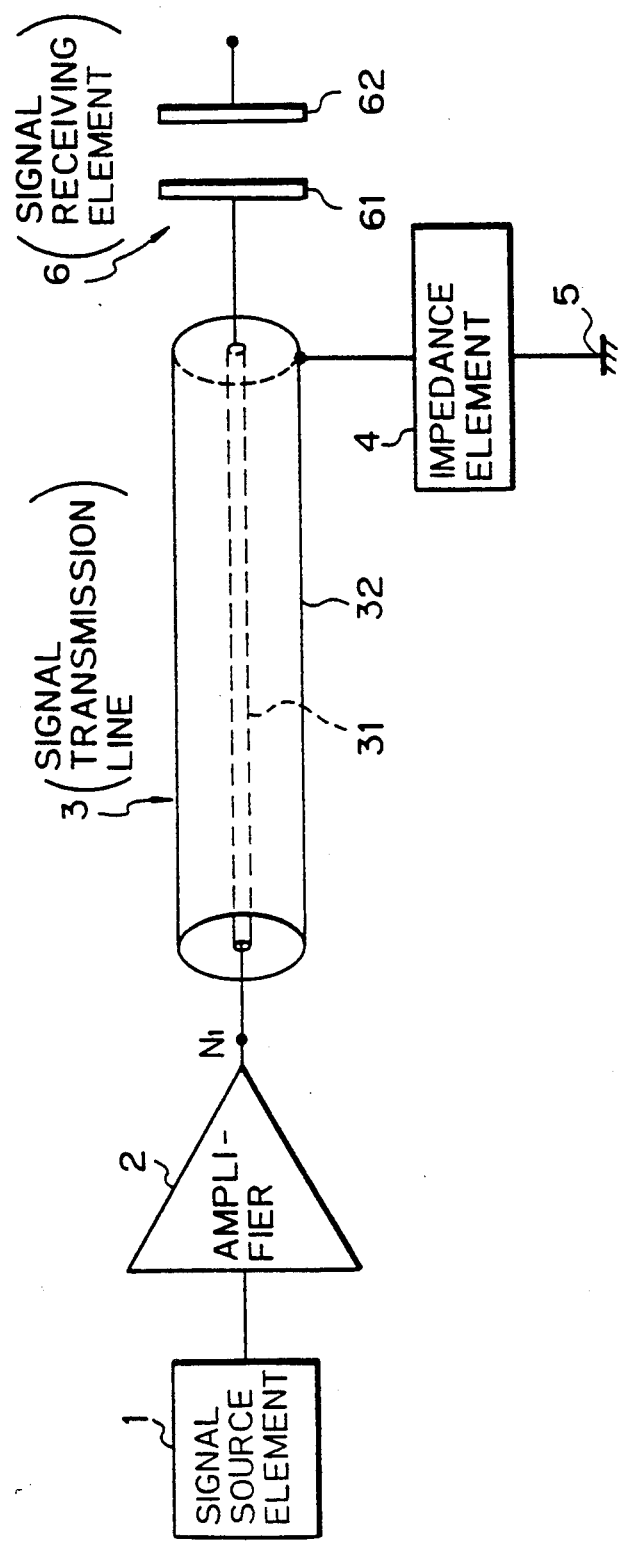
FIG. 1 is a schematic illustration of the signal transmission circuit according to an embodiment of the present invention.

A schematic illustration of the signal transmission circuit according to an embodiment of the present invention is shown in FIG. 1. In the signal transmission circuit of FIG. 1, there are provided a signal source element 1, an amplifier 2, a signal transmission line 3 consisting, for example, of a signal line 31 and an external conductor 32, a terminal impedance 4, a ground 5, and a signal receiving element 6. In FIG. 1, the signal receiving element 6 is shown, as an example, as being constituted by a pair of electrodes 61 and 62 used for an electron beam exposing apparatus.

In FIG. 1, the signal transmission line 3 is a coaxial cable constituted by an internal conductor 31 as the signal line and an external conductor 32 as the grounding line.

The amplifier 2 receives and amplifies a signal, such as a signal for deflection, from the signal source element 1, and the amplified signal is supplied through the node $N_1$ to the internal conductor 31 of the signal transmission line 3. The external conductor 32 is grounded through a high impedance element 4 connected to the external conductor 32 at a point between the input and output ends of the external conductor 32 and the ground 5 through the element 4. An example of the element 4 is a resistor R shown in FIG. 2A. The resistance of the resistor R is selected as, for example, between 1 kΩ and 100 kΩ.

As the coaxial cable 3, for example, a coaxial cable having a characteristic impedance of 75 Ω and a capacitance of 65 pF/m is used. Thus, it is preferable that the resistance of the resistor R is selected as 10 times through 1,000 times the characteristic impedance of the coaxial cable 3.

The signal transmitted through the coaxial cable 3 is supplied to the signal receiving element 6, such as a pair of deflection electrodes 61 and 62.

In the operation of the circuit of FIG. 1, since the resistance of the resistor R is greater than the characteristic impedance 75 Ω of the coaxial cable 3, when a current flows through the internal conductor 31, the external conductor 32, the resistor R, and the ground 5, the potential of the external conductor 32 is immediately raised to become almost the same as the potential of the internal conductor 31, so that the charging of the capacitance of the coaxial cable 3 is almost unnecessary. Thus, the potential of the internal conductor 31 is immediately raised, and the potential of the pair of deflection electrodes 61 and 62 is immediately raised accordingly.

After the output of the transmission circuit is settled, the signal becomes a signal having a low frequency component, and the impedance of the capacitance component of the coaxial cable 3 becomes greater than the resistance of the resistor R, and accordingly the potential of the external conductor 32 becomes ground potential.

Figure 2A:
FIG. 2A shows an example of the grounding element in the signal transmission circuit.
Figure 2B:
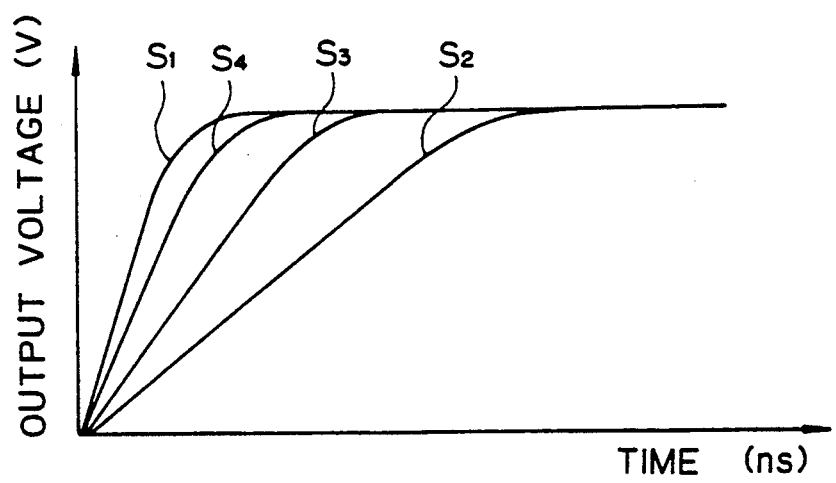
FIG. 2B shows a characteristic of operation of the signal transmission circuit.

The characteristic of the output of the coaxial cable using the resistor R (FIG. 2A) for the impedance element is shown in FIG. 2B. In FIG. 2B, $S_1$ is the voltage at the node $N_1$ in the case where the coaxial cable 3 and the deflection electrodes 6 do not exist. $S_2$ is the output voltage in the case where the coaxial cable 3 and the deflection electrodes 6 are connected, and the resistance of the resistor R is 0 Ω. $S_3$ is the output voltage in the case where the coaxial cable 3 and the deflection electrodes 6 are connected, and the resistance of the resistor R is 1 kΩ. $S_4$ is the output voltage in the case where the coaxial cable 3 and the deflection electrodes 6 are connected, and the resistance of the resistor R is 10 kΩ.

In FIG. 2B, the curve $S_4$ represents the characteristic of the operation of the circuit of FIG. 1 and FIG. 2A. With the characteristic shown by $S_4$, the signal is transmitted at high speed with less signal delay, the grounding function of the external conductor 32 is improved when the frequency of the signal deviates from the frequency range of the deflection signal, and thus the internal conductor 31 is satisfactorily shielded, and accordingly the low-noise transmission of the signal with the prevention of the ill effects caused by noise can be achieved. In consequence, for example, in electron beam exposure, the exposing of the electron beam can be achieved precisely, corresponding closely to the deflection signal, in a relatively short time period, so that the throughput of the electron beam exposing apparatus is enhanced.

In the experiments conducted by the inventor, using a coaxial cable of approximately 1 m, almost no improvement in the output waveform is achieved in the case where the resistance of the resistor is 100 Ω, a small effect is achieved in the case where the resistance of the resistor is 1 kΩ, and the effect is maximum in the case where the resistance of the resistor is greater than 10 kΩ. In the case where the resistance of the resistor is greater than 100 kΩ, the effect of noise is no longer negligible. Accordingly, it is proven that the resistance of the resistor of approximately 10 times through 1,000 times the characteristic impedance of the coaxial cable is the optimum resistance.

Figure 3A:
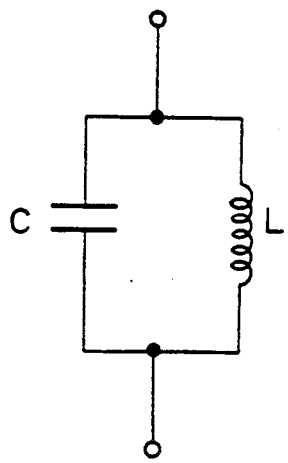
FIG. 3A shows another example of the grounding element in the signal transmission circuit.

For the element 4 in the circuit of FIG. 1, it is also possible to use a parallel resonant circuit consisting of a capacitance C nd an inductance L shown in FIG. 3A.

The impedance Z of the CL parallel resonant circuit is calculated as follows.

$$\frac{1}{Z} = j\omega C + \frac{1}{j\omega L}$$

$$Z = \frac{1}{j\omega Z} \frac{\omega^2 LC}{\omega^2 LC - 1}$$

$$|Z| = \frac{\omega C}{\omega^2 LC - 1}$$

The absolute value $|Z|$ of the impedance Z is maximum, i.e., infinite, where $\omega^2 LC$ is equal to unity.

Figure 3B:
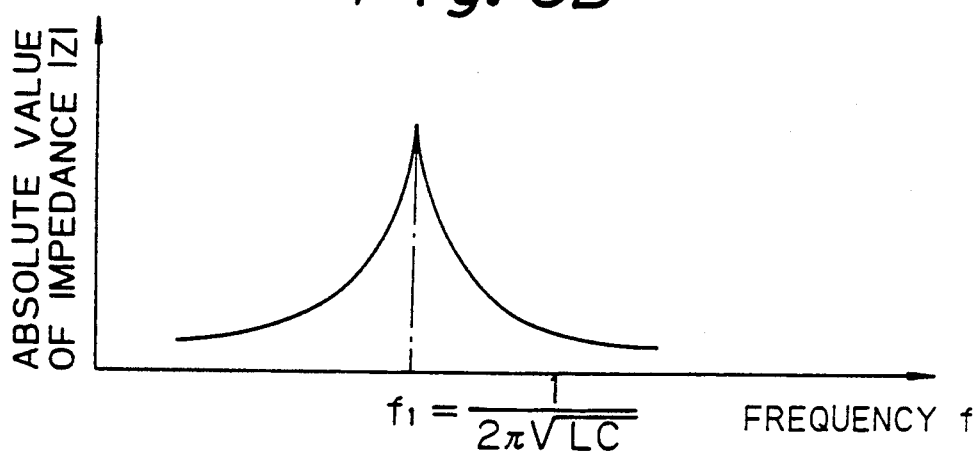
FIGS. 3B and 3C shows characteristics of operation of the signal transmission circuit.

The characteristic of the absolute value $|Z|$ of the impedance Z regarding frequency is shown in FIG. 3B. Since $\omega$ is equal to $2\pi f$, the absolute value $|Z|$ becomes maximum when the frequency $f_1$ is given as follows.

$$f_1 = \frac{1}{2\pi \sqrt{LC}}$$

Therefore, if this equation for $f_l$ is established where the center frequency of the deflection signal is $f_1$, and the value of the capacitance C is selected, the impedance of the parallel resonant circuit will be increased for the frequency of the deflection signal, and the speed of the rise of the signal at the deflection electrode will be increased.

Figure 3C:
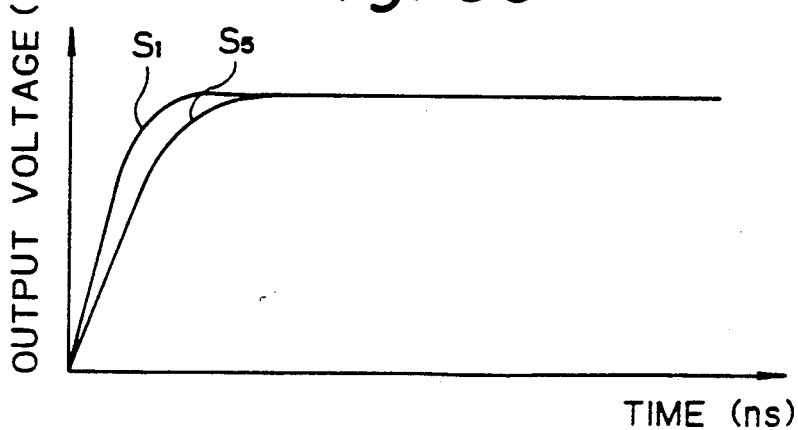

The characteristic of the output of the coaxial cable using the parallel resonance circuit CL (FIG. 3A) for the element is shown as $S_5$ in FIG. 3C.

As the difference of the frequency from the frequency of the deflection signal increases, the impedance of the parallel resonance circuit becomes lower, and the grounding effect of the external conductor 32 as the grounding line becomes more favorable, so that the shielding of the internal conductor as the signal line becomes more sufficient and the prevention of the ill effects caused by noise becomes more satisfactory.

In the case of using the parallel resonant circuit shown in FIG. 3A, the resonance frequency for the LC parallel resonant circuit is regulated intentionally to tune the circuit to the center frequency of the signal for deflection, and the effects obtained in this case may be greater than those obtained in the case of the use of the resistor shown in FIG. 2A.

Also, for the element 4 in the circuit of FIG. 1, it is further possible to use other combinations of a resistance, an inductance, a capacitance, or other elements to increase the impedance of the external conductor as the grounding line.

Figure 4:
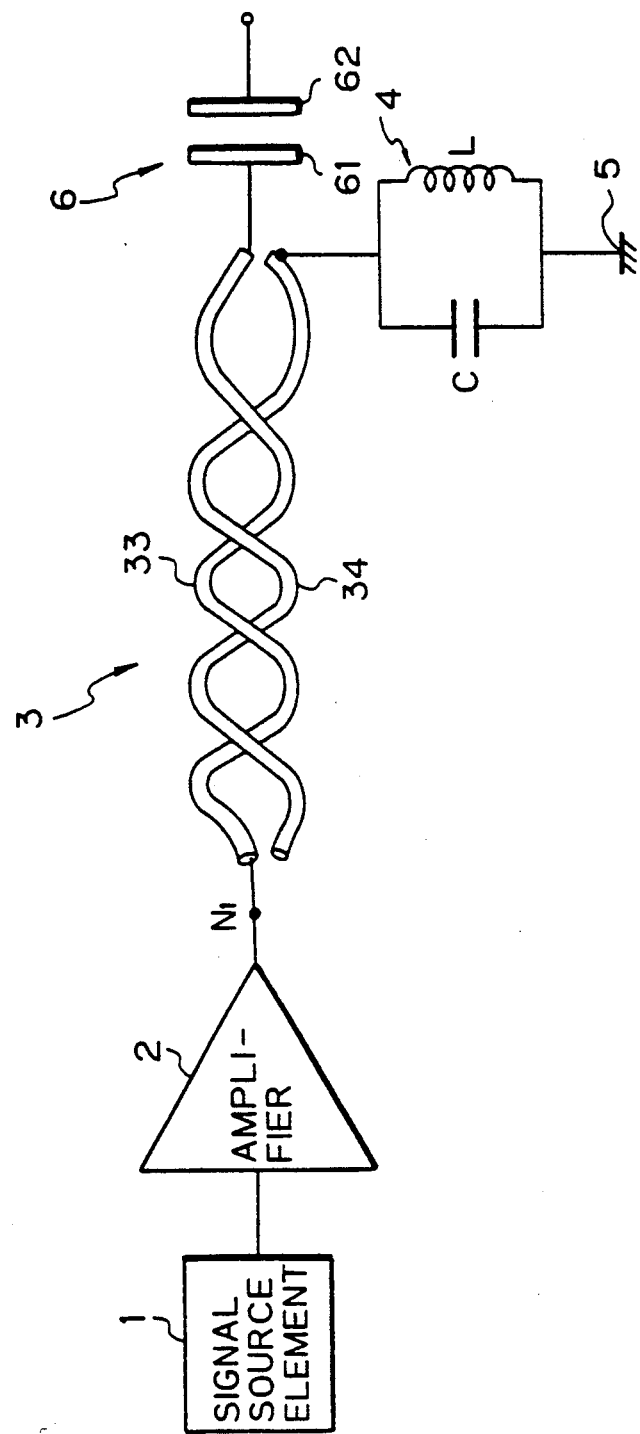
FIG. 4 shows a schematic illustration of the signal transmission circuit according to another embodiment of the present invention.

Also, for the structure of the signal transmission line 3 in the circuit of FIG. 1, it is also possible to use a stranded wire structure as shown in FIG. 4. In the circuit shown in FIG. 4, the characteristic impedance of a pair of stranded wires 33 and 34 is about the same as that of the coaxial cable 3 in FIG. 1. The parallel resonant circuit consisting of the capacitance C and the inductance L is connected between one stranded wire 34 and ground. The effect of the circuit of FIG. 4 is similar to that of FIG. 1.

In the circuit of FIG. 1, if the element 4 is connected at the output end of the grounding line 32, the distance between the point of the ground line 32 connected with the ground level portion and the point of the signal source element 1 connected with the ground level portion is increased, and accordingly, the oscillation in the loop constituted by the signal line 31., the element 4, the ground level portion 5, and the signal source element 1 can be prevented.

In the circuit of FIG. 1, if the grounding line 32 is connected at a plurality of points to the grounding level portion, a loop is formed between the signal line and the ground level portion, and thus an oscillation may occur. To avoid this problem, it is preferable to connect the grounding line to the ground level portion at one point.

Figure 5:
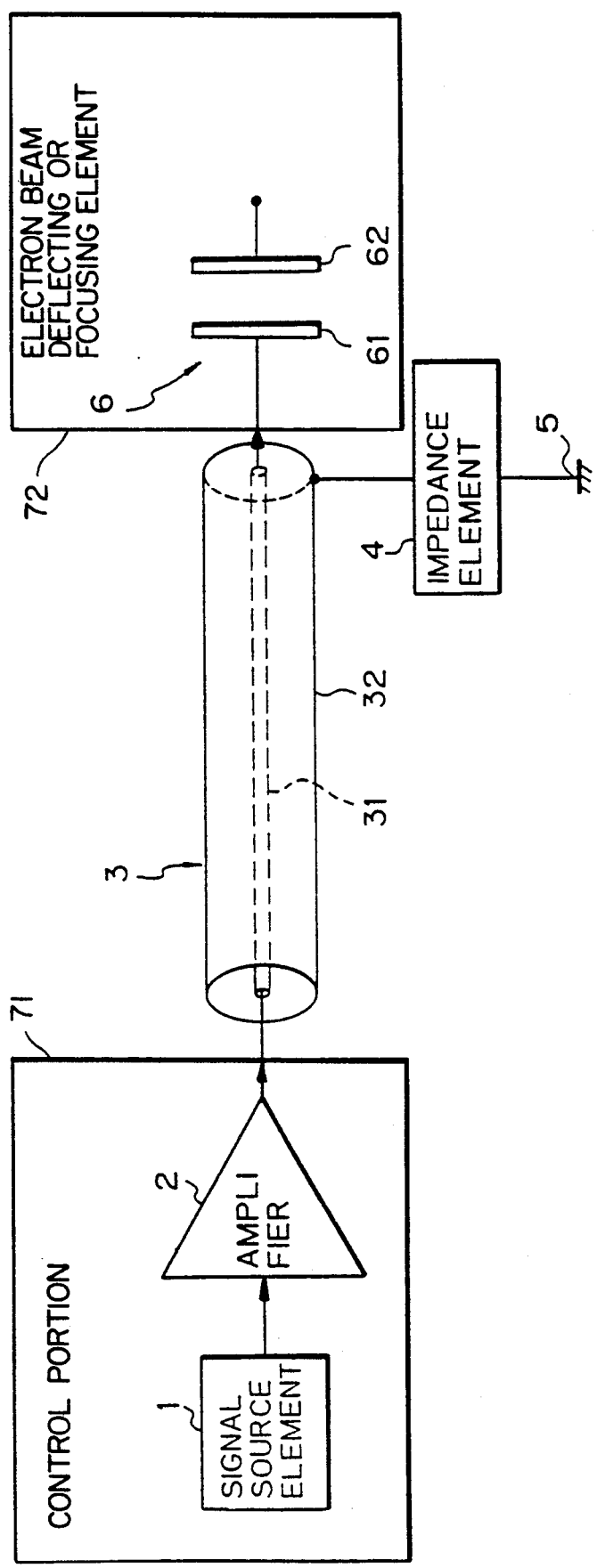
FIG. 5 shows a schematic illustration of the signal transmission circuit according to even another embodiment of the present invention.

FIG. 5 illustrates an electron beam exposing apparatus using the signal transmission circuit. A control portion 71 of the electron beam exposing apparatus connects to the signal line 31. An opposing end of the signal line 31 connects to an electron beam deflecting or focusing element 72 containing the pair of deflection electrodes 61 and 62.

In applying the signal transmission circuit according to the present invention to an electron beam exposing apparatus using the deflection electrodes for the electrostatic deflection, it is also possible to adopt electromagnetic deflection using a deflection coil. It is also possible to apply the signal transmission circuit of the present invention to driving an electron beam focusing coil or an electron beam focusing electrode.

The signal transmission circuit according to the present invention is applicable not only to the electron beam exposing apparatus but to other apparatuses for signal transmission, such as, for example, for connecting a measurement portion and an analyzer portion in a microwave testing apparatus, for connecting an oscillator portion and a signal input portion and for connecting two kinds of apparatuses separated from each other.

I claim:

1. A signal transmission circuit between a signal source element and a signal receiving element for transmitting a signal therethrough, comprising:
    a signal line through which the signal is transmitted from the signal source element to the signal receiving element;
    a grounding line arranged lengthwise along said signal line and consisting of solely one connection thereto at a predetermined position between an input end and an opposing output end, wherein said grounding line prevents disturbing effects of noises outside of a frequency range of the signal from being transmitted; and
    a resonant circuit connected solely from ground to said grounding line at solely the one predetermined position on said grounding line, said resonant circuit having a high impedance sufficient to cause a high speed transmission of the signal in the frequency range of the signal.

2. A circuit according to claim 1, wherein said resonant circuit is connected at the output end of said grounding line.

3. A circuit according to claim 1, wherein said resonant circuit consists of a resistor having a resistance more than 10 times a characteristic impedance of a signal transmission line constituted by said signal line and said grounding line.

4. A circuit according to claim 1, wherein said resonant circuit is adapted to be tuned to the frequency of the signal transmitted through said signal line.

5. A circuit according to claim 4, wherein said resonant circuit consists of an inductance and a capacitance connected in parallel.

6. A circuit according to claim 1, wherein said signal line and said grounding line are arranged as a coaxial cable.

7. A circuit according to claim 1, wherein said signal line and said grounding lines are arranged as a twisted pair of wires.

8. A signal transmission circuit between a signal source element and a signal receiving element for transmitting a signal therethrough, comprising:
    a signal line through which the signal is transmitted from the signal source element to the signal receiving element;
    a grounding line arranged lengthwise along said signal line and consisting of solely one connection thereto at a predetermined position between an input end and an opposing output end; and
    a high impedance element connected solely from ground to said grounding line at solely the one predetermined position on said grounding line; and
    wherein the signal transmitted through said signal line is a signal for deflection for an electron beam exposing apparatus, the signal receiving element is an electron beam deflecting or focusing element in said electron beam exposing apparatus, and the signal transmission circuit is connected between a control portion of said electron beam exposing apparatus and said electron beam deflecting or focusing element.

* * * * *

UNITED STATES PATENT AND TRADEMARK OFFICE
CERTIFICATE OF CORRECTION

PATENT NO. : 5,208,560
DATED : May 4, 1993
INVENTOR(S) : Nobuyuki YASUTAKE

It is certified that error appears in the above-indentified patent and that said Letters Patent is hereby corrected as shown below:

Col. 3, line 66, "nd" should be --and--.

Col. 4, line 5, " $Z=\frac{1}{jwZ}$ " should be -- $Z=\frac{1}{jwC}$ --.

Col. 5, line 30, after portion (second occurrence) insert --,--.

Col. 6, line 23, "lines" should be --line--.

Signed and Sealed this

Twelfth Day of April, 1994

Attest:

BRUCE LEHMAN

Attesting Officer

Commissioner of Patents and Trademarks